United States Patent
Mor et al.

(10) Patent No.: US 10,551,178 B2
(45) Date of Patent: *Feb. 4, 2020

(54) OVERLAPPING PATTERN PROJECTOR

(71) Applicant: Apple Inc., Cupertino, CA (US)

(72) Inventors: Zafrir Mor, Ein Habsor (IL); Boris Morgenstein, Tel Aviv (IL)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/370,997

(22) Filed: Mar. 31, 2019

(65) Prior Publication Data

US 2019/0226838 A1 Jul. 25, 2019

Related U.S. Application Data

(63) Continuation of application No. 16/005,720, filed on Jun. 12, 2018, now Pat. No. 10,288,417, which is a
(Continued)

(51) Int. Cl.
*G02B 27/10* (2006.01)
*G01B 11/25* (2006.01)
(Continued)

(52) U.S. Cl.
CPC ...... *G01B 11/2513* (2013.01); *G02B 27/1093* (2013.01); *G02B 27/20* (2013.01); *G02B 27/4205* (2013.01); *G06F 3/0304* (2013.01); *G06F 3/042* (2013.01); *G06K 9/00201* (2013.01); *G06K 9/2036* (2013.01); *H01S 5/005* (2013.01); *H01S 5/423* (2013.01);
(Continued)

(58) Field of Classification Search
CPC .................................................. G02B 27/4205
See application file for complete search history.

(56) References Cited

U.S. PATENT DOCUMENTS

| 5,774,219 A | 6/1998 | Matsuura |
| 6,026,110 A | 2/2000 | Makino |

(Continued)

FOREIGN PATENT DOCUMENTS

| CN | 101267086 A | 9/2008 |
| CN | 102611002 A | 7/2012 |

(Continued)

OTHER PUBLICATIONS

TW Application # 107129761 office action dated Apr. 8, 2019.
(Continued)

*Primary Examiner* — Joseph L Williams
*Assistant Examiner* — Jacob R Stern
(74) *Attorney, Agent, or Firm* — Kligler & Associates Patent Attorneys Ltd

(57) ABSTRACT

An optoelectronic device includes a semiconductor substrate, an array of optical emitters arranged on the substrate in a two-dimensional pattern, a projection lens and a diffractive optical element (DOE). The projection lens is mounted on the semiconductor substrate and is configured to collect and focus light emitted by the optical emitters so as to project optical beams containing a light pattern corresponding to the two-dimensional pattern of the optical emitters on the substrate. The DOE is mounted on the substrate and is configured to produce and project multiple overlapping replicas of the pattern.

20 Claims, 4 Drawing Sheets

Related U.S. Application Data continuation of application No. 15/057,140, filed on Mar. 1, 2016, now Pat. No. 10,054,430, which is a continuation-in-part of application No. 14/341,860, filed on Jul. 28, 2014, now abandoned, and a continuation-in-part of application No. 14/242,895, filed on Apr. 2, 2014, now abandoned, which is a continuation of application No. 13/567,095, filed on Aug. 6, 2012, now Pat. No. 8,749,796.

(60) Provisional application No. 61/521,406, filed on Aug. 9, 2011, provisional application No. 61/611,075, filed on Mar. 15, 2012.

(51) Int. Cl.

| | | |
|---|---|---|
| *G02B 5/18* | (2006.01) | |
| *H01S 5/00* | (2006.01) | |
| *H01S 5/42* | (2006.01) | |
| *G02B 27/20* | (2006.01) | |
| *G02B 27/42* | (2006.01) | |
| *G06K 9/20* | (2006.01) | |
| *G06F 3/03* | (2006.01) | |
| *G06F 3/042* | (2006.01) | |
| *G06K 9/00* | (2006.01) | |
| *H01S 5/022* | (2006.01) | |
| *F21Y 115/10* | (2016.01) | |

(52) U.S. Cl.
CPC ..... *F21Y 2115/10* (2016.08); *G06K 2209/401* (2013.01); *H01S 5/02288* (2013.01)

(56) References Cited

U.S. PATENT DOCUMENTS

| | | |
|---|---|---|
| 6,222,868 B1 | 4/2001 | Ouchi et al. |
| 6,281,867 B2 | 8/2001 | Kurematsu et al. |
| 6,798,438 B2 | 9/2004 | Beier et al. |
| 2002/0153422 A1 | 10/2002 | Tsikos et al. |
| 2003/0021326 A1 | 1/2003 | Liao et al. |
| 2004/0011457 A1 | 1/2004 | Kobayashi et al. |
| 2008/0205462 A1 | 8/2008 | Uchida |
| 2008/0279241 A1 | 11/2008 | Oki et al. |
| 2009/0010297 A1 | 1/2009 | Uchida |
| 2010/0311502 A1 | 12/2010 | Miller et al. |
| 2012/0249743 A1 | 10/2012 | Kim et al. |
| 2012/0293625 A1 | 11/2012 | Schneider et al. |
| 2014/0199844 A1 | 7/2014 | Palmer |
| 2015/0260830 A1 | 9/2015 | Ghosh et al. |

FOREIGN PATENT DOCUMENTS

| | | |
|---|---|---|
| CN | 105048282 A | 11/2015 |
| JP | 2011228553 A | 11/2011 |
| KR | 1020070018805 A | 2/2007 |
| WO | 2015078857 A1 | 6/2015 |

OTHER PUBLICATIONS

U.S. Appl. No. 15/648,473 office action dated Jun. 24, 2019.
KR Application # 10-2013-0023877 office action dated Jul. 31, 2019.
CN Application # 201821292011.1 Utility Model Patent Evaluation Report (UMPER) dated Sep. 16, 2019.
U.S. Appl. No. 15/953,460 office action dated Nov. 15, 2019.
U.S. Appl. No. 16/524,313 office action dated Nov. 22, 2019.
CN Utility Model Patent # 201821292011.1 Notification of Review Opinions on Patentability Evaluation Report dated Dec. 2, 2019.
EP Patent Application # 19189860.0 Extended Search Report dated Nov. 27, 2019.

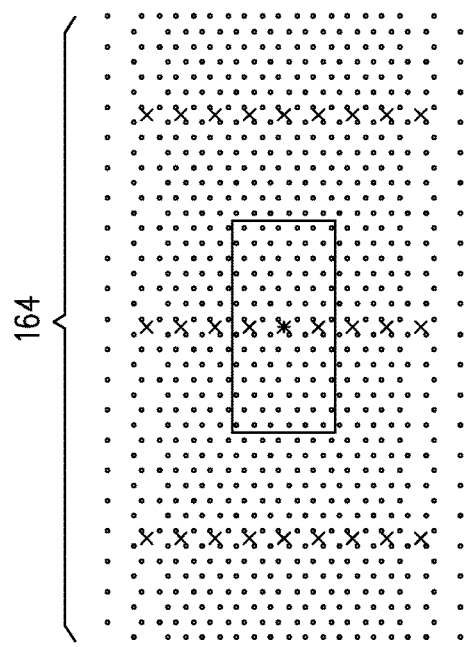
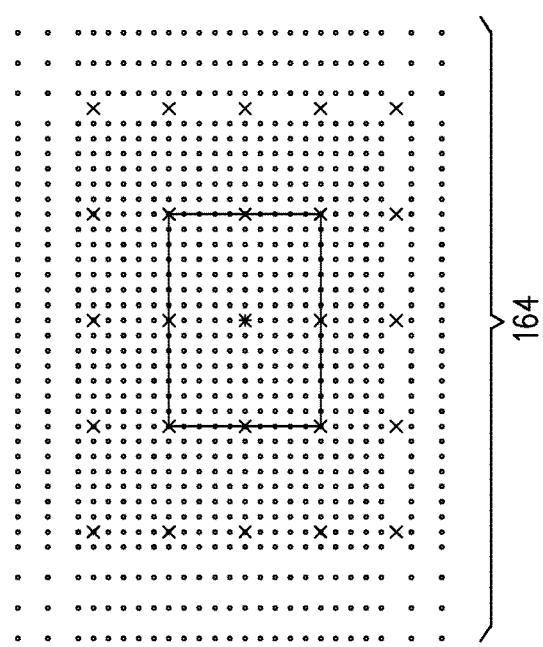
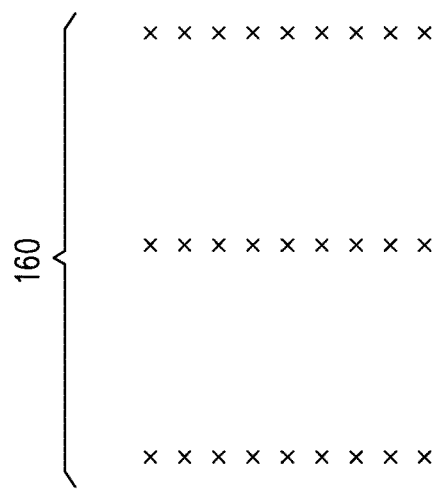
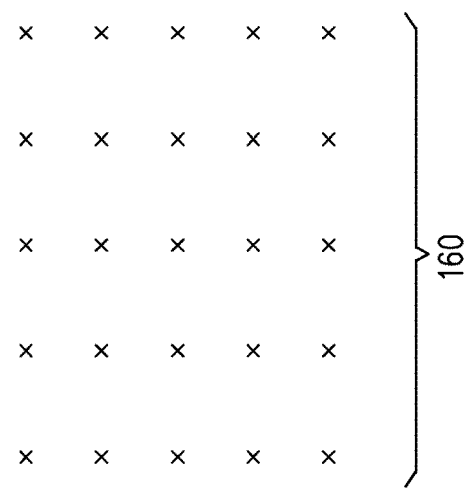
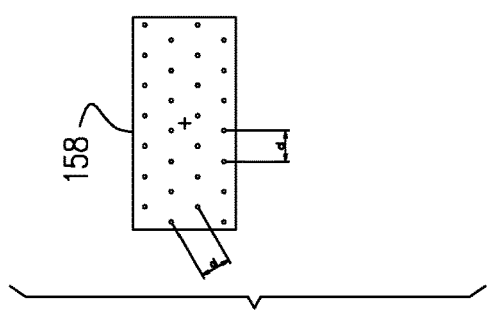
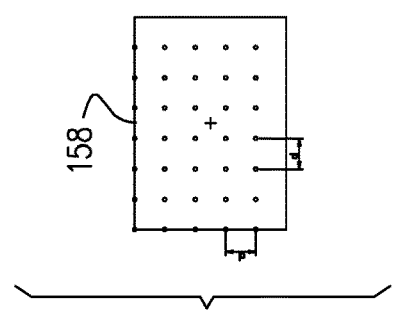
FIG. 4
FIG. 5

OVERLAPPING PATTERN PROJECTOR

CROSS-REFERENCE TO RELATED APPLICATIONS

This application is a continuation of U.S. patent application Ser. No. 16/005,720, filed Jun. 12, 2018, which is a continuation of U.S. patent application Ser. No. 15/057,140, filed Mar. 1, 2016 (now U.S. Pat. No. 10,054,430), which is a continuation-in-part of U.S. patent application Ser. No. 14/341,860, filed Jul. 28, 2014 (abandoned), and of U.S. patent application Ser. No. 14/242,895, filed Apr. 2, 2014 (abandoned), which is a continuation of U.S. patent application Ser. No. 13/567,095, filed Aug. 6, 2012 (now U.S. Pat. No. 8,749,796), which claims the benefit of U.S. Provisional Patent Application 61/521,406, filed Aug. 9, 2011, and U.S. Provisional Patent Application 61/611,075, filed Mar. 15, 2012. All of these related applications are incorporated herein by reference.

FIELD OF THE INVENTION

The present invention relates generally to optical projection, and particularly to integrated optical projectors.

BACKGROUND OF THE INVENTION

Micro-miniature optical projectors are used in a variety of applications. For example, such projectors may be used to cast a pattern of coded or structured light onto an object for purposes of 3D mapping (also known as depth mapping). In this regard, U.S. Pat. No. 8,150,142, whose disclosure is incorporated herein by reference, describes an apparatus for mapping an object. The apparatus includes an illumination assembly, which includes a single transparency containing a fixed pattern of spots. A light source trans-illuminates the single transparency with optical radiation so as to project the pattern onto the object. An image capture assembly captures an image of the pattern that is projected onto the object, and a processor processes the image so as to reconstruct a three-dimensional (3D) map of the object.

PCT International Publication WO 2008/120217, whose disclosure is incorporated herein by reference, describes further aspects of the sorts of illumination assemblies that are shown in the above-mentioned U.S. Pat. No. 8,150,142. In one embodiment, the transparency comprises an array of micro-lenses arranged in a non-uniform pattern. The micro-lenses generate a corresponding pattern of focal spots, which is projected onto the object.

U.S. Pat. No. 8,749,796, whose disclosure is incorporated herein by reference, describes integrated pattern generators in which laser diodes (such as VCSELs) are arranged in a pattern that is not a regular lattice. Optics may be coupled to project the pattern of light emitted by the elements of a laser diode array into space as a pattern of corresponding spots, wherein each spot contains the light emitted by a corresponding laser diode in the array. In some embodiments, a DOE creates multiple replicas of the pattern, fanning out over an expanded angular range.

SUMMARY OF THE INVENTION

An embodiment of the present invention that is described herein provides an optoelectronic device including a semiconductor substrate, an array of optical emitters arranged on the substrate in a two-dimensional pattern, a projection lens and a diffractive optical element (DOE). The projection lens is mounted on the semiconductor substrate and is configured to collect and focus light emitted by the optical emitters so as to project optical beams containing a light pattern corresponding to the two-dimensional pattern of the optical emitters on the substrate. The DOE is mounted on the substrate and is configured to produce and project multiple overlapping replicas of the pattern.

In some embodiments, the pattern has a given pitch, and the multiple overlapping replicas have a combined pitch that is finer than the given pitch. In an embodiment, the optical emitters include vertical cavity surface emitting laser (VCSEL) devices. In a disclosed embodiment, the DOE is configured to produce the multiple replicas so as to overlap in one dimension. In an alternative embodiment, the DOE is configured to produce the multiple replicas so as to overlap in two dimensions.

In an embodiment, the two-dimensional pattern of the light-emitting elements does not lie on a regular lattice. In another embodiment, the two-dimensional pattern of the light-emitting elements is an uncorrelated pattern. In yet another embodiment, the two-dimensional pattern of the light-emitting elements is a regular grid pattern. In still another embodiment, the projection lens and the DOE are formed on a single optical substrate.

In some embodiments, the two-dimensional pattern of the light-emitting elements is divided into two or more subsets that are individually addressable, and the device includes control circuitry that is configured to address combinations of one or more of the subsets so as to control the overlapping replicas for creating multiple different pattern densities. In some embodiments, the DOE is configured to create transversal offsets between duplication in adjacent columns of the projected optical beams, so as to reduce an ambiguity in depth estimation that is based on measuring transversal shifts in the projected optical beams along the columns.

There is additionally provided, in accordance with an embodiment of the present invention, a method for producing an optoelectronic device. The method includes providing a semiconductor substrate, and forming an array of optical emitters on the substrate in a two-dimensional pattern. A projection lens is mounted on the semiconductor substrate so as to collect and focus light emitted by the optical emitters, thereby projecting optical beams containing a light pattern corresponding to the two-dimensional pattern of the optical emitters on the substrate. A diffractive optical element (DOE) is mounted on the substrate so as to produce and project multiple overlapping replicas of the pattern.

The present invention will be more fully understood from the following detailed description of the embodiments thereof, taken together with the drawings in which:

BRIEF DESCRIPTION OF THE DRAWINGS

FIGS. 2-5 are diagrams that schematically illustrate projected overlapping patterns, in accordance with embodiments of the present invention;

DETAILED DESCRIPTION OF EMBODIMENTS

Overview

Embodiments of the present invention that are described hereinbelow provide optical projectors having improved pattern density, and associated methods. In some embodiments, an optical projector comprises an array of optical emitters, e.g., vertical cavity surface emitting lasers (VCSELs), and a projection lens. The optical emitters in combination with the lens generate a pattern of light spots having a certain pitch or density. This pitch is limited by the physical distances between the emitters in the array, and the focal length of the projection lens. The physical distances between emitters cannot be reduced below some minimal distance due to implementation reasons. Increasing the focal length of the lens, on the other hand, would increase the projector height and reduce its depth of field. In the embodiments described herein, the projector is able to achieve a finer pitch, i.e., high pattern density, by generating multiple replicas of the pattern that overlap one another.

In some embodiments, the projector further comprises a pattern replication element, e.g., a Fan-Out beam splitter created by diffractive optical element (DOE). The beam splitter produces and projects multiple replicas of the pattern created by the VCSEL array and lens. The multiple replicas overlap one another, such that the resulting combined pattern of separated light spots has a density that is denser than the density achieved by the optical emitter array and lens alone. Several such implementations are described herein.

In some embodiments, the density of the projected pattern is controlled dynamically by addressable operation of batches of the emitters in the array. Other disclosed embodiments mitigate possible ambiguities in depth estimation, which may be caused by pattern similarity of the replicas.

The disclosed techniques are highly effective in producing optical spot patterns having high angular density. The angular separation between the spots is no longer constrained by the ratio of the physical distances between the emitters in the array and the focal length of the projection lens.

System Description

Figure 1:
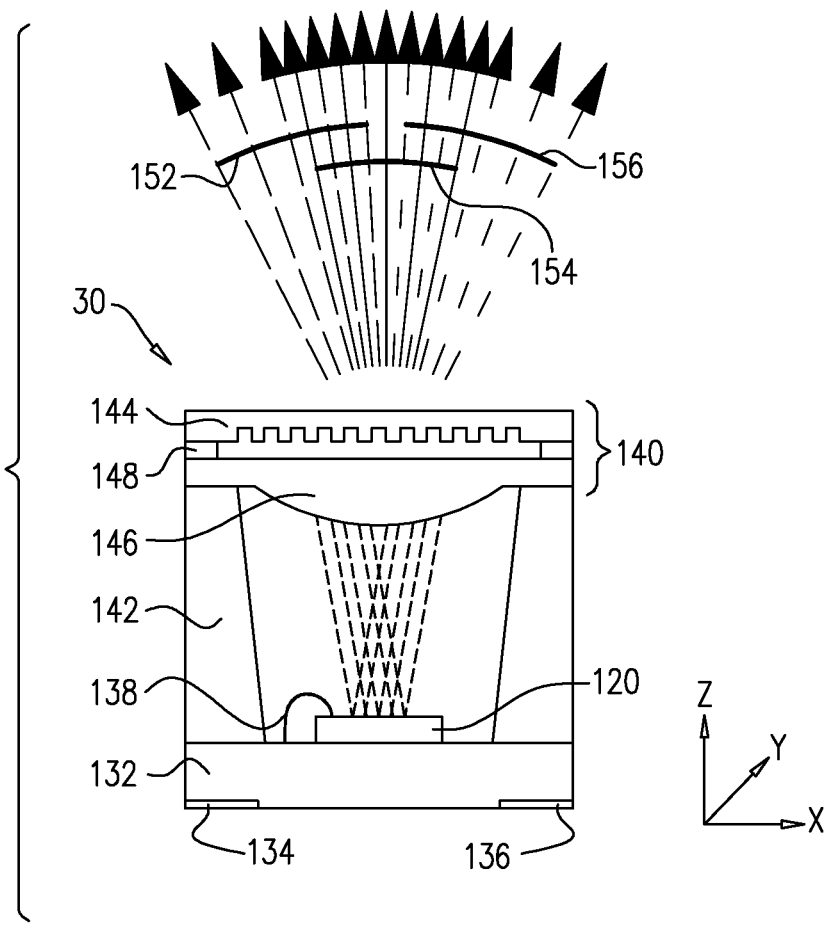
FIG. 1 is a schematic diagram of an integrated optical projector, in accordance with an embodiment of the present invention.

FIG. 1 is a schematic diagram of an integrated optical projector 30, in accordance with an embodiment of the present invention. In a typical application, projector 30 produces and projects a pattern of light spots onto an object or scene, in order to enable an imaging and processing system (not shown) to analyze the projected pattern and estimate a three-dimensional (3-D) map of the object or scene. The 3-D map, also referred to as a depth map, can be used for various purposes, such as for user gesture recognition as part of a Man-Machine Interface (MMI). Projector 30 may be integrated into various host systems, such as mobile communication or computing devices.

In the example of FIG. 1, projector 30 comprises a semiconductor die 120 having an array of optical emitters disposed thereon. In the embodiments described herein the emitters comprise Vertical Cavity Surface Emitting Lasers (VCSELs). In alternative embodiments, however, any other suitable type of laser diodes or other optical emitters can be used. The VCSELs are constructed on die 120 in a certain geometrical layout, e.g., a regular grid or an uncorrelated (e.g., quasi-random) layout. Several examples of such geometrical patterns are discussed further below.

In the embodiment of FIG. 1, die 120 is mounted on a sub-mount substrate 132, and is electrically connected to substrate 132 using wire bonds 138. External interconnect terminals, e.g., an anode contact 134 and a cathode contact 136, are formed on the opposite surface of substrate 132. A projection lens 146 is mounted on spacers 142, typically such that die 120 lies on the focal plane of the lens. A Fan-Out Diffractive Optical Element (FO-DOE) 144 is mounted above projection lens 146 using thin spacers 148.

Projection lens 146 collects and collimates the light emitted by the individual VCSELs on die 120. The combination of the VCSELs and the projection lens generates a pattern of light spots (e.g., grid or quasi-random) according to the geometrical layout of the VCSELs on die 120. In particular, the pitch or density of the projected pattern, i.e., the angular separation between light spots, is determined by the physical distances between the VCSELs on die 120 and the focal length of projection lens 146. This pattern of light spots is referred to herein as a baseline pattern.

DOE 144 functions as a beam splitter, which produces and projects multiple replicas of the baseline pattern onto the object or scene. The multiple replicas are angularly-offset relative to one another, and overlap one another. The resulting pattern of light spots, which comprises the superposition of the multiple replicas of the baseline pattern, is referred to herein as a composite pattern. Due to the overlap between the multiple replicas, the pitch or density of the composite pattern is higher than that of the baseline pattern. Moreover, the pitch or density of the composite pattern is no longer limited by the physical distances between VCSELs and by the focal length of the projection lens.

The top of FIG. 1 shows an example of three replicas of the baseline pattern, having an overlap of 50% between them, denoted 152, 154 and 156. As can be seen in the figure, the pitch of the composite pattern is two times finer than the pitch of the baseline pattern (the pitch of a single replica). The example of FIG. 1 is highly simplified for the sake of clarity. Several real-life examples are described in the following figures. For example, FIG. 1 shows pattern replication in one dimension. In alternative embodiments, DOE 144 may generate replicas that are angularly-offset and overlap in two dimensions.

The configuration of projector 30 in FIG. 1 is an example configuration, which is chosen purely for the sake of conceptual clarity. In alternative embodiments, any other suitable projector configuration can be used. FO DOE 144 may comprise, for example, a Damman grating or a similar element, as described in U.S. Patent Application Publication 2009/0185274, whose disclosure is incorporated herein by reference.

In some embodiments, projection lens 146 and DOE 144 may be fabricated as a single integrative element. Further alternatively, the lens may be constructed from a stack of lenses similar to camera lenses. In the context of the present patent application and in the claims, lens 146 and DOE 144 are referred to collectively as "optics" that project the 2-D layout of the emitters array and generate multiple overlapping replicas of the baseline pattern. In alternative embodiments, the optics may be implemented in any other suitable way.

Projected Overlapping Pattern Examples

FIGS. 2-5 are diagrams that schematically illustrate overlapping pattern configurations, in accordance with embodiments of the present invention. In each of the figures, the left-hand side shows a single replica 158 of the projection pattern, with the light spots shown as circles, the center of the lens marked with a cross, and the period of pattern (in case of replication without overlap) marked by a rectangular frame. This layout also corresponds to the baseline pattern that is subsequently replicated by FO DOE 144.

The middle of each figure shows a replication scheme 160 carried out by FO DOE 144, with the center position of each replica marked with "x". The right-hand side of each figure shows a corresponding composite pattern 164 that is projected from DOE 144. In pattern 164, the light spots are marked with circles, the center position of each replica is marked with "x", and the lens center is marked with a cross.

For ease of comparison, the center of composite pattern 164 in each figure (corresponding to the zero-order of DOE 144) is marked with a rectangle. As can be seen clearly in the figures, the density of circles in the area of pattern 164 in which the replicas overlap (i.e., the density of the composite pattern) is higher than the density of circles in baseline pattern 158.

Figure 2:
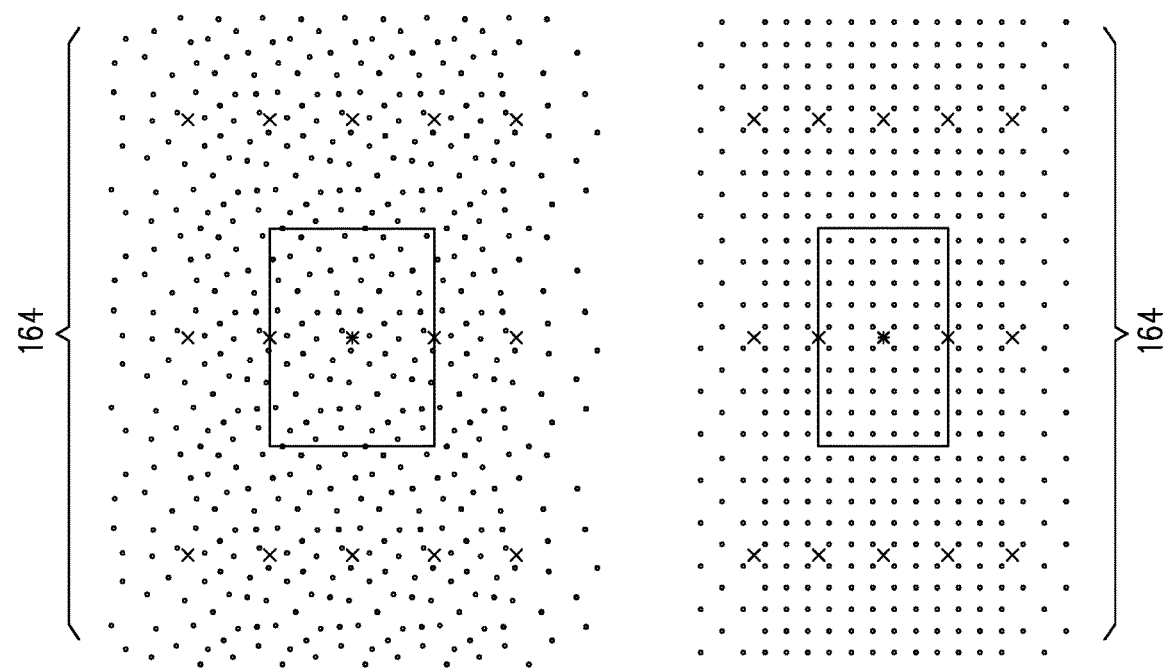
Figure 2:
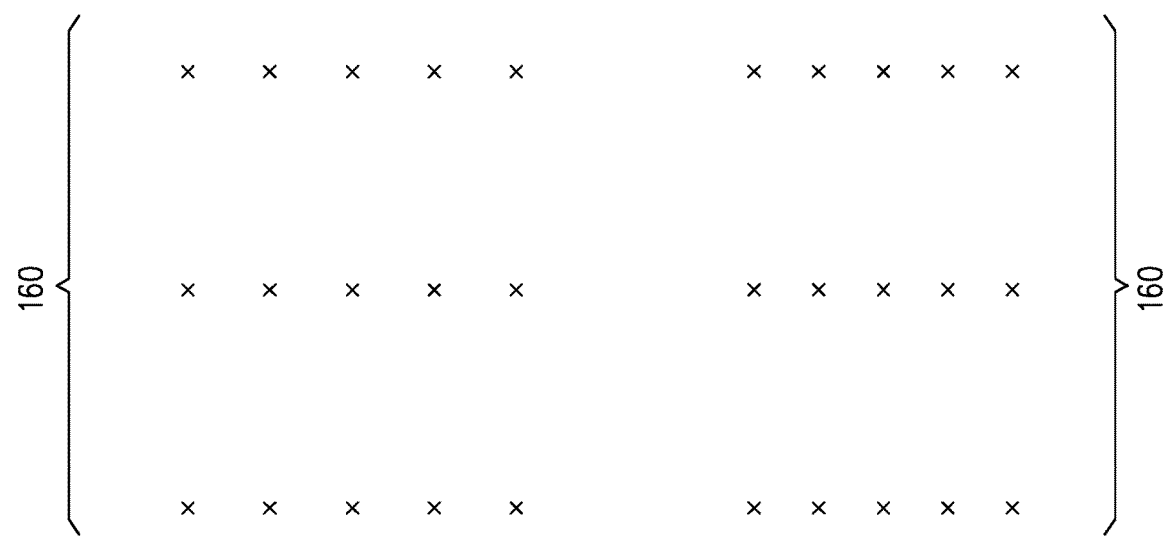
Figure 2:
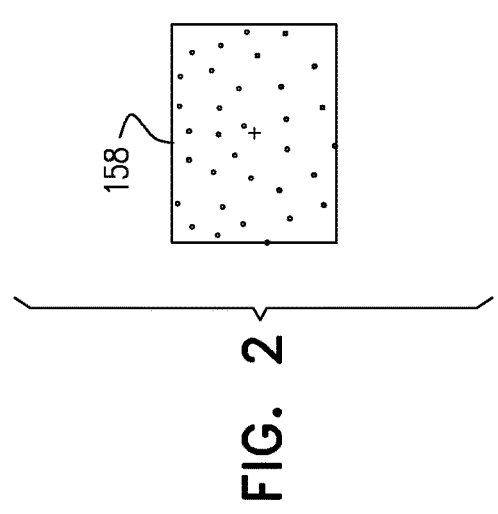

In the example of FIG. 2, VCSEL array 120 has an uncorrelated, quasi-random layout. The array is designed with the physical minimal distance limitations of the array, but also takes into account that 50% overlap in the y-axis will still reserve minimum distance between the spots. FO DOE 144 performs 3×5 replication, i.e., replicates the baseline pattern three times along one axis (referred to arbitrarily as horizontal according to the orientation of the figure), and five times along the orthogonal axis (referred to as vertical). On the horizontal axis, the FO period (distance between "x" markers in configuration 160) is identical to the width of baseline pattern 158. On the vertical axis, the FO period is half the dimension of the baseline pattern.

In this example, it can be seen that ⅔ of the projected pattern 164 includes a dense pattern, while on both vertical ends the pattern is sparse since it has no overlap. In this simplified example the sparse pattern occupies a relatively large portion of the pattern, because the example has a small number of replicas. In a real-life projector, the number of replicas is larger and therefore the portion of the sparse pattern out of the total Field of View (FOV) is smaller. With a quasi-random layout it is difficult to demonstrate the overlap effect and the potential for increasing the density vs. enlarging the overlap, since it is very much related to the pattern design. Therefore, the next examples refer to the use of a grid pattern.

Figure 3:
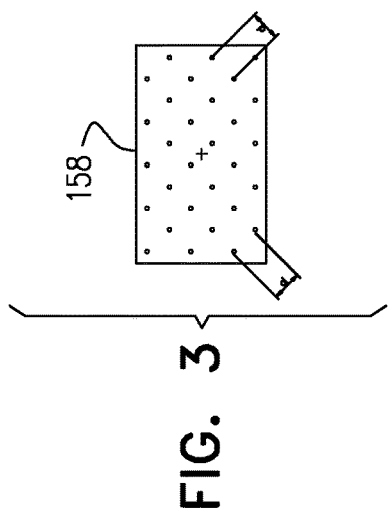

In the example of FIG. 3, pattern 158 generated from a VCSEL grid array has a 45° regular grid with a minimal distance of d. FO DOE 144 performs 3×5 replication, with the same horizontal and vertical periods as in FIG. 2. In the center of the resulting composite pattern 164, the number of spots per unit area is doubled, and the distance between spots is d/$\sqrt{2}$.

In FIGS. 2 and 3, the overlap ratio between adjacent replicas is 50%. The disclosed techniques, however, are not limited to 50% overlap and can be used with any other suitable (typically larger) overlap ratios.

In FIG. 4, pattern 158 generated from the VCSEL array has a hexagonal grid layout with a minimal available distance of d. FO DOE 144 performs 3×9 replication, with a horizontal FO period identical to the width of the baseline pattern and a vertical FO period equal to a ⅓ of the pattern height. In this constellation the overlap ratio is 66.67%. As a result, the center of the resulting composite pattern 164 has three times more spots per unit area, and a distance between spots of d/$\sqrt{3}$.

In the examples of FIGS. 2-4 above, the FO DOE creates replicas that overlap only in one dimension (the vertical dimension). FIG. 5 demonstrates the possibility of introducing overlap in both dimensions, in accordance with an embodiment of the present invention. In the example of FIG. 5, baseline pattern 158 has a square lattice layout with minimum distance d. FO DOE 144 performs 5×5 replication, with both the horizontal FO period and the vertical FO period equal to half the geometrical pattern angles. In this configuration the overlap ratio is 50% along each axis. The resulting composite pattern is a square lattice with four times more spots per unit area and a distance of d/2.

The schemes of FIGS. 2-4 are depicted purely by way of example. In alternative embodiments, projector 30 can be implemented using any other suitable layout of VCSEL array, and any other suitable FO configuration.

Dynamic Control of Composite Pattern Density

In some scenarios, it is desirable to have dynamic control over the density of the spots in the composite pattern. In some embodiments, projector 30 is able to increase and decrease the spot density by dividing the VCSEL array into segments, and activating or deactivating each segment selectively.

Figure 6:
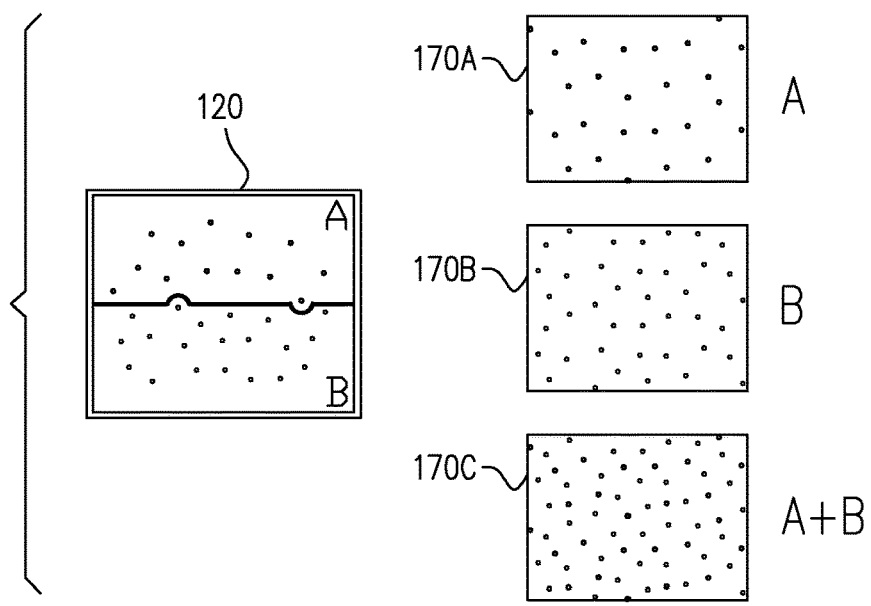
FIG. 6 is a diagram illustrating dynamic control of projected pattern density, in accordance with an embodiment of the present invention.

FIG. 6 is a diagram illustrating dynamic control of projected pattern density, in accordance with an embodiment of the present invention. The left-hand side of the figure shows VCSEL array 120 that generates the pattern of FIG. 2 above. In this example, however, the VCSEL array is divided into two segments denoted A and B. The two segments are isolated from one another by a horizontal groove in the middle of the array.

Projector 30 comprises control circuitry (not shown in the figure) for driving the VCSELs of each segment separately, e.g., by applying or shutting-off electrical power supply to each segment separately. Thus, the control circuitry may drive only segment A (in which case the VCSELs of segment A emit light and the VCSELs of segment B are dark), drive only segment B (in which case the VCSELs of segment B emit light and the VCSELs of segment A are dark), or drive both segments (i.e., VCSELs of both segments emit light).

The right-hand side of FIG. 6 shows the resulting patterns that are created by replication using a FO DOE as describe for FIG. 2 (only the area of the center pattern is shown). Since the FO period is half the pattern width, it is identical to the width of the pattern that is generated by operation only half of the array. Therefore, the replication matches half of the array (on have gaps and no overlap between the tile). Three patterns 170A . . . 170O are shown, corresponding to the three above-described modes (denoted "A", "B" and "A+B"), respectively. As can be seen in the figure, the spot density varies from one mode to another. Since the 2-D pattern of each part (A or B) of the VCSEL array is configured with a different density, the projection patterns shown in 170A, 170B, 170C are sparse, medium and dense, respectively.

The partitioning of VCSELs into segments shown in FIG. 6 is an example partitioning, which is depicted purely for the sake of conceptual clarity. In alternative embodiments, the VCSELs may be divided into any suitable number of segments in any desired manner. For example, an array that is designed for 50% overlap in both axes may be divided into four quadrants. Different segments need not necessarily comprise the same number of VCSELs or have similar shapes.

Reducing Ambiguity in Depth Estimation When Using Overlapping Spot-Pattern Replicas As noted above, in some embodiments the composite pattern projected by projector 30 is used for computing a 3-D map ("depth map") of the scene or object over which the pattern is projected. Depths can be estimated from a captured image of the projected pattern by measuring the local transverse shift of the pattern, relative to a known reference, at each point in the captured image. The depth coordinate of each point can be calculated by triangulation based on the local transverse shifts of the pattern. The transversal shifts are typically estimated along some epipolar line.

In the embodiments described above, however, the composite pattern is made-up of multiple shifted replicas of some baseline pattern. As a result a "tile" pattern is duplicated across the FOV with a tile period that is identical to the FO period. Although the composite tile pattern itself is internally designed to be uncorrelated, the entire tile will be highly correlated to the neighboring tiles. As a result the transversal shift is no longer singular, and ambiguity will be created in the solution. In such a case, the resulting depth estimation will be erroneous. Such an ambiguity may occur if the required scanning range causes transversal shifts of the same order or larger than the offsets between adjacent replicas in the composite pattern in the direction of the epipolar line between the camera and projector.

Assume, without loss of generality, that the epipolar line (over which transversal shifts are measured) is the horizontal axis of the figures. When only vertical overlap is used (such as in FIGS. 2-4) the ambiguity range is defined by the FO horizontal period that is identical to the baseline pattern width. The ambiguity range is half of the baseline pattern width when both vertical and horizontal overlap is used (such as in FIG. 5). It is possible in principle to reduce this ambiguity by enlarging the VCSEL array since the unambiguous angle is defined by the dimension of VCSEL array 120 and the focal length of the lens 146. This solution, however, is costly for the VCSEL array, adds complexity to the optics, and is not always feasible.

In some embodiments, FO DOE 144 is designed to overcome the above-described ambiguity. Instead of having the FO diffractive orders Nx, Ny, DOE 144 can be designed with the FO diffractive orders Nx, k·Ny, wherein k=2, 3, . . . . This FO has an interleaved design: Each column still includes only Ny orders, but it is offset transversely by one order relative to the neighbor column. This design creates a tiled composite pattern, in which each column of tiles is offset transversely (along the vertical axis) relative to the neighboring column of replicas by an offset that is a fraction of the tile height (vertical-axis). As a result of this offset between replicas, the range of unambiguous depth measurement is effectively increased by a factor of k.

Figure 7:
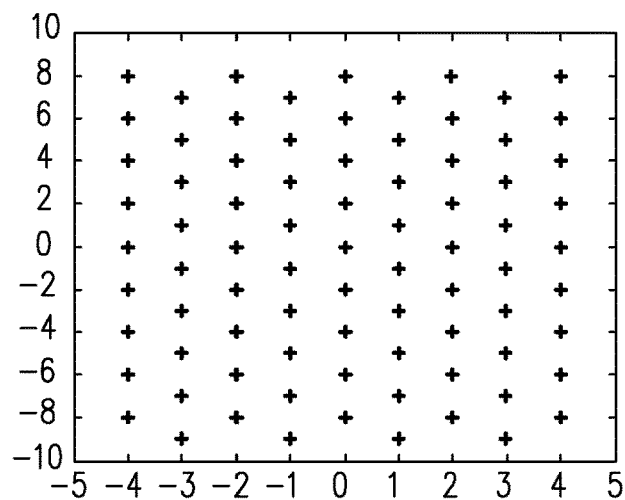
FIGS. 7 and 8 are diagrams illustrating fanout order patterns having reduced ambiguity, in accordance with embodiments of the present invention.
Figure 8:
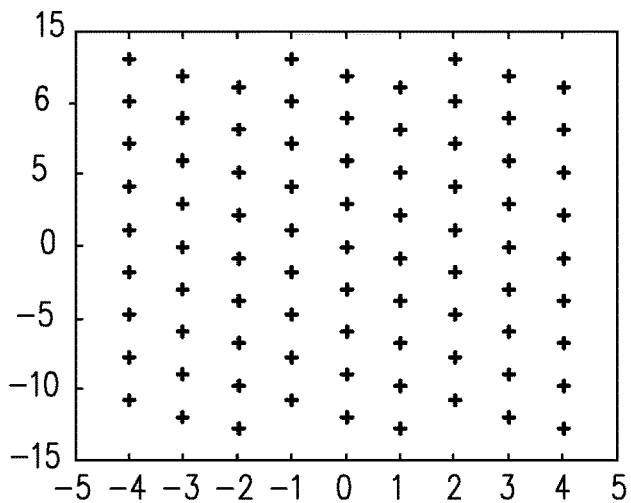

FIGS. 7 and 8 are diagrams showing examples of FO designs having reduced ambiguity, in accordance with embodiments of the present invention. In both figures, crosses mark the positions of active FO orders. Both FO are configured to 9×9 orders (while the remaining orders are zero) for producing 9×9 replication of the baseline pattern. The crosses also represent the centers of the replicas of the baseline pattern.

In FIG. 7, k=2, meaning that two orders represent the angular dimension of the tile along the vertical axis (the baseline pattern for 50% overlap is four times the FO period). The transversal offset between adjacent replicas in this example is one FO order, which is half the vertical offset between tiles. As can be seen in the figure, the repetition period over the horizontal axis is now two horizontal FO orders. In FIG. 8, k=3, meaning that three orders represent the angular dimension of the tile along the vertical axis (the baseline pattern for 50% overlap is six times the FO period). In this example the transversal offset between adjacent replicas is one order, which is ⅓ of the vertical offset between tiles. As can be seen in the figure, the repetition period over the horizontal axis is now three horizontal FO orders.

The interleaved FO designs shown in FIGS. 7 and 8 are examples of designs that suppress the unwanted FO orders to zero by design. These examples are depicted purely for the sake of conceptual clarity. In alternative embodiments, the FO may include any number of orders with any interleave number in any desired manner.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An optoelectronic device, comprising:
a semiconductor substrate;
an array of optical emitters, arranged on the substrate in a two-dimensional pattern;
optics configured to collect and focus light emitted by the optical emitters, which define a baseline light pattern having a given pitch, corresponding to the two-dimensional pattern of the optical emitters on the substrate, and to produce and project multiple overlapping replicas of the baseline light pattern with a composite pattern density that is finer than the pitch of the baseline light pattern.

2. The device according to claim 1, wherein the optical emitters comprise vertical cavity surface emitting laser (VCSEL) devices.

3. The device according to claim 1, wherein the optics are configured to produce the multiple replicas so as to overlap in one dimension.

4. The device according to claim 1, wherein the optics are configured to produce the multiple replicas so as to overlap in two dimensions.

5. The device according to claim 1, wherein the two-dimensional pattern of the optical emitters does not lie on a regular lattice.

6. The device according to claim 1, wherein the two-dimensional pattern of the optical emitters is an uncorrelated pattern.

7. The device according to claim 1, wherein the two-dimensional pattern of the optical emitters is a regular grid pattern.

8. The device according to claim 1, wherein the optics comprise a diffractive optical element (DOE).

9. The device according to claim 1, wherein the two-dimensional pattern of the optical emitters is divided into two or more subsets that are individually addressable, and comprising control circuitry that is configured to address combinations of one or more of the subsets so as to control the overlapping replicas for creating multiple different pattern densities.

10. The device according to claim 1, wherein the optics are configured to create transversal offsets between duplication in adjacent columns of the projected optical beams, so as to reduce an ambiguity in depth estimation that is based on measuring transversal shifts in the projected optical beams along the columns.

11. A method for producing an optoelectronic device, the method comprising:

providing a semiconductor substrate;

forming an array of optical emitters on the substrate in a two-dimensional pattern;

collecting and focusing light emitted by the optical emitters, which emit respective optical beams in a baseline light pattern having a given pitch, corresponding to the two-dimensional pattern of the optical emitters on the substrate, and projecting the collected light so as to produce multiple overlapping replicas of the baseline light pattern with a composite pattern density that is finer than the pitch of the baseline light pattern.

12. The method according to claim 11, wherein the optical emitters comprise vertical cavity surface emitting laser (VCSEL) devices.

13. The method according to claim 11, wherein the multiple replicas overlap in one dimension.

14. The method according to claim 11, wherein the multiple replicas overlap in two dimensions.

15. The method according to claim 11, wherein the two-dimensional pattern of the optical emitters does not lie on a regular lattice.

16. The method according to claim 11, wherein the two-dimensional pattern of the optical emitters is an uncorrelated pattern.

17. The method according to claim 11, wherein the two-dimensional pattern of the optical emitters is a regular grid pattern.

18. The method according to claim 11, wherein projecting the collected light comprises interposing in the beams emitted by the optical emitters a diffractive optical element (DOE).

19. The method according to claim 11, wherein the two-dimensional pattern of the optical emitters is divided into two or more subsets that are individually addressable, and comprising providing control circuitry that addresses combinations of one or more of the subsets so as to control the overlapping replicas for creating multiple different pattern densities.

20. The method according to claim 11, wherein projecting the collected light comprises creating a transversal offsets between adjacent columns of the projected optical beams, so as to reduce an ambiguity in depth estimation that is based on measuring transversal shifts in the projected optical beams along the columns.

* * * * *